(12) United States Patent
Gao et al.

(10) Patent No.: US 10,267,823 B2
(45) Date of Patent: Apr. 23, 2019

(54) DIGITAL CLAMP METER AND AUTOMATIC MEASUREMENT METHOD THEREOF

(71) Applicant: Shenzhen New Huayi Instrument Co., Ltd., Shenzhen, Guangdong (CN)

(72) Inventors: Chao Gao, Guangdong (CN); Chenglong Wang, Guangdong (CN)

(73) Assignee: Shenzhen New Huayi Instrument Co., Ltd., Shenzhen (CN)

( * ) Notice: Subject to any disclaimer, the term of this patent is extended or adjusted under 35 U.S.C. 154(b) by 318 days.

(21) Appl. No.: 15/218,102

(22) Filed: Jul. 25, 2016

(65) Prior Publication Data

US 2017/0023624 A1 Jan. 26, 2017

(30) Foreign Application Priority Data

Jul. 23, 2015 (CN) .......................... 2015 1 0437474

(51) Int. Cl.
*G01R 19/25* (2006.01)
*G01R 15/12* (2006.01)
*G01R 15/18* (2006.01)

(52) U.S. Cl.
CPC ............ *G01R 15/125* (2013.01); *G01R 15/18* (2013.01)

(58) Field of Classification Search
CPC .. G01R 15/181; G01R 19/0092; G01R 15/18; G01R 15/183; G01R 15/186
USPC ........................................................ 324/127
See application file for complete search history.

(56) References Cited

U.S. PATENT DOCUMENTS

| | | | | | |
|---|---|---|---|---|---|
| 3,535,593 A | * | 10/1970 | Schweitzer, Jr. | ...... | H02H 3/003 307/127 |
| 3,706,032 A | * | 12/1972 | Vikstrom | ................. | G01R 1/22 324/117 R |
| 3,876,933 A | * | 4/1975 | Herrington | .......... | G01R 19/255 324/607 |
| 4,074,193 A | * | 2/1978 | Kohler | .................... | H01F 38/36 324/126 |
| 4,258,348 A | * | 3/1981 | Belfer | ..................... | H01F 38/30 336/105 |
| D260,635 S | * | 9/1981 | Lockwood | ................... | D13/110 |
| 4,717,872 A | * | 1/1988 | Wagner | ............... | G01R 15/202 324/117 H |

(Continued)

FOREIGN PATENT DOCUMENTS

CN 201004072 Y 1/2008
CN 204989279 U 1/2016

*Primary Examiner* — Christopher P McAndrew

(57) ABSTRACT

A digital clamp meter includes a common input, a voltage/resistance input, a current transformer, a voltage/resistance measuring circuit, an AC measuring circuit, a MPU and a displayer. A detecting input of the voltage/resistance measuring circuit is connected to the voltage/resistance input, a detecting output of the voltage/resistance measuring circuit is connected to a signal input of the MPU, and a controlled terminal of the voltage/resistance measuring circuit is connected to a controlling output of the MPU. The signal output of the MPU is connected to the displayer. The common input is grounded. A detecting input of the AC measuring circuit is connected to a secondary winding of the current transformer, a detecting output of the AC measuring circuit is connected to the signal input of the MPU, and a controlled terminal of the AC measuring circuit is connected to the controlling output of the MPU.

6 Claims, 6 Drawing Sheets

(56) References Cited

U.S. PATENT DOCUMENTS

| | | | | |
|---|---|---|---|---|
| 4,837,519 A * | 6/1989 | Lopetrone | G01R 27/18 | 324/528 |
| 4,855,671 A * | 8/1989 | Fernandes | G01K 1/024 | 324/127 |
| 5,084,679 A * | 1/1992 | Lofgren | G01N 27/048 | 174/11 R |
| 5,541,503 A * | 7/1996 | Berkcan | G01R 15/181 | 324/117 R |
| 6,046,582 A * | 4/2000 | Sanelli | G01R 15/125 | 324/115 |
| 6,470,283 B1 * | 10/2002 | Edel | G01R 19/2513 | 324/72.5 |
| 7,174,261 B2 * | 2/2007 | Gunn | G01R 15/185 | 324/547 |
| 7,557,563 B2 * | 7/2009 | Gunn | G01R 15/183 | 324/117 H |
| 2005/0052191 A1 * | 3/2005 | Prussin | G01N 27/041 | 324/719 |
| 2011/0247604 A1 * | 10/2011 | Anderson | F23N 5/08 | 126/39 BA |
| 2011/0295427 A1 * | 12/2011 | Motzer | B25J 9/162 | 700/258 |
| 2013/0063160 A1 * | 3/2013 | Nakano | G01R 31/06 | 324/653 |
| 2013/0107585 A1 * | 5/2013 | Sims | H02M 3/33592 | 363/21.14 |
| 2013/0135111 A1 * | 5/2013 | Hart | H01H 71/125 | 340/644 |
| 2013/0147276 A1 * | 6/2013 | Yamamoto | H02J 3/387 | 307/64 |
| 2013/0314069 A1 * | 11/2013 | Suzuki | H02M 5/02 | 323/318 |
| 2014/0091788 A1 * | 4/2014 | Misaki | G01R 15/202 | 324/253 |
| 2014/0176123 A1 * | 6/2014 | Okumura | G01R 15/202 | 324/127 |
| 2014/0177672 A1 * | 6/2014 | Davis | A46B 9/028 | 374/152 |
| 2014/0200843 A1 * | 7/2014 | Shamir | G01R 21/133 | 702/107 |
| 2014/0210479 A1 * | 7/2014 | Rink | G01R 1/203 | 324/426 |
| 2014/0232376 A1 * | 8/2014 | Yasui | G01R 15/202 | 324/127 |
| 2014/0312923 A1 * | 10/2014 | Alley | G01R 19/0092 | 324/713 |
| 2014/0320122 A1 * | 10/2014 | Fukui | G01R 19/0092 | 324/244 |
| 2015/0008911 A1 * | 1/2015 | Majer | G01R 19/0092 | 324/234 |
| 2015/0019013 A1 * | 1/2015 | Rose | G01L 1/16 | 700/258 |
| 2015/0022196 A1 * | 1/2015 | Hebiguchi | G01R 15/207 | 324/244 |
| 2015/0022199 A1 * | 1/2015 | Mito | G01R 15/207 | 324/252 |
| 2015/0028857 A1 * | 1/2015 | Hachida | G01R 19/0092 | 324/207.11 |
| 2015/0042324 A1 * | 2/2015 | Fujita | G01R 19/0092 | 324/244 |
| 2015/0084617 A1 * | 3/2015 | Popovic | G01R 15/207 | 324/127 |
| 2015/0112618 A1 * | 4/2015 | Shamir | G01R 15/186 | 702/61 |
| 2015/0138347 A1 * | 5/2015 | Davis | A46B 9/028 | 348/135 |
| 2015/0318777 A1 * | 11/2015 | Pasqua | H02M 1/36 | 363/21.13 |
| 2016/0054359 A1 * | 2/2016 | Kotake | G01R 15/181 | 324/127 |
| 2016/0054360 A1 * | 2/2016 | Higuma | G01R 15/14 | 324/127 |
| 2016/0084879 A1 * | 3/2016 | Luo | G01R 1/0416 | 324/127 |
| 2016/0097794 A1 * | 4/2016 | Lint | G01R 15/181 | 324/127 |
| 2016/0209451 A1 * | 7/2016 | Shamir | G01R 15/186 | |

\* cited by examiner

DIGITAL CLAMP METER AND AUTOMATIC MEASUREMENT METHOD THEREOF

CROSS REFERENCE TO RELATED APPLICATIONS

This non-provisional patent application claims priority under 35 U.S.C. § 119(a) from Chinese Patent Application No. 201510437474.7 filed on Jul. 23, 2015, the contents of which are hereby incorporated by reference.

FIELD OF THE INVENTION

This invention relates to electrical measurement, and in particular, to a digital clamp meter and an automatic measurement method thereof.

BACKGROUND OF THE INVENTION

More and more people pay attention to the safety of electrical measurement. At present, about 9,000 workers are disabled during electrical measurement every day, and more than 80% of the accidents are caused by operation error in use of the measuring instruments. In the art, the related measuring meter needs to switch among dozens of gears to select a function matching the type of the signal to be measured, otherwise leads the accidents, such as using AC voltage measuring function to measure DC voltage, using resistance measuring function to measure AC voltage, and etc.

SUMMARY OF THE INVENTION

Accordingly, the present invention provides a digital clamp meter being capable of selecting functions automatically and a measurement method of the digital clamp meter.

The present invention provide a digital clamp meter which includes:
  a common input;
  a voltage/resistance input cooperating with the common input for inputting voltage to be measured or resistance to be measured;
  a voltage/resistance measuring circuit for detecting and processing the voltage to be measured or resistance to be measured;
  a current transformer for induction detecting when the measured signal is alternating current;
  an AC measuring circuit for detecting and processing induction current generated in a secondary winding of the current transformer;
  a displayer for displaying values of measured voltage, resistance or alternating current; and
  a MPU for controlling working of the voltage/resistance measuring circuit and processing outputting signal of the voltage/resistance measuring circuit, controlling the displayer to display value of measured voltage or resistance, controlling working of the AC measuring circuit and processing outputting signal of the AC measuring circuit, and controlling the displayer to display measured AC value;
  wherein a detecting input of the voltage/resistance measuring circuit is connected to the voltage/resistance input, a detecting output of the voltage/resistance measuring circuit is connected to a signal input of the MPU, and a controlled terminal of the voltage/resistance measuring circuit is connected to a controlling output of the MPU; the signal output of the MPU is connected to the displayer; the common input is grounded; a detecting input of the AC measuring circuit is connected to the secondary winding of the current transformer, a detecting output of the AC measuring circuit is connected to the signal input of the MPU, and a controlled terminal of the AC measuring circuit is connected to the controlling output of the MPU.

Preferably, the voltage/resistance measuring circuit includes a voltage measuring circuit and a resistance measuring circuit, detecting inputs of the voltage measuring circuit and resistance measuring circuit are connected to the voltage/resistance input, detecting outputs of the voltage measuring circuit and resistance measuring circuit are connected to the signal input of the MPU, and controlled terminals of the voltage measuring circuit and resistance measuring circuit are connected to the controlling output of the MPU.

Preferably, further includes an alarm connected to the MPU, the alarm being used to alarm sound when the measured resistance value less than a predetermined value.

Preferably, the the resistance measuring circuit includes a constant-current source circuit, an electronic switch, a high voltage protecting circuit, and a voltage signal processing circuit; and wherein the constant-current source circuit is connected with the voltage signal processing circuit through the high voltage protecting circuit, the constant-current source circuit is connected to an input of the electronic switch, and channel selecting pins of the electronic switch are connected to the MPU.

Preferably, the constant-current source circuit includes an operating voltage input, a reference voltage input, a first operational amplifier, a NMOS transistor, a first resistor, a second resistor, a third resistor, a fourth resistor, a fifth resistor, a sixth resistor, and a seventh resistor; wherein a positive power supply of the first operational amplifier is connected to the operating voltage input, a negative power supply of the first operational amplifier is grounded, and a first non-inverting input of the first operational amplifier is connected to first ends of the first, second, third, and fourth resistors; wherein a second end of the first resistor is connected to a first pin of a first set of input pins of the electronic switch, a second end of the second resistor is connected to a second pin of the first set of input pins of the electronic switch, a second end of the third resistor is connected to a third pin of the first set of input pins of the electronic switch, and a second end of the fourth resistor is connected to a fourth pin of the first set of input pins of the electronic switch; wherein the common pin Y, GND pin, EN pin, and NC pin of the electronic switch are grounded, the source pin of the electronic switch is connected to the operating voltage input, and the channel selecting pins of the electronic switch are connected to the controlling output of the MPU; wherein a first inverting input of the first operational amplifier is connected to first ends of fifth and six resistors, a second end of the fifth resistor is grounded, and a second end of the sixth resistor is connected to the reference voltage input; and wherein a first output of the first operational amplifier is connected to a gate of the NMOS transistor and a first end of the seventh resistor, a second end of the seventh resistor is grounded, a source of the NMOS transistor is connected to the high voltage protecting circuit, and a drain of the NMOS transistor is connected to the first non-inverting input of the first operational amplifier.

Preferably, the high voltage protecting circuit includes a first diode, a varistor, and a diode of the NMOS transistor; and wherein a cathode of the first diode is connected to a cathode of the diode of the NMOS transistor, an anode of the first diode is connected to a first end of the varistor and the voltage signal processing circuit, and a second end of the varistor is grounded.

Preferably, the voltage signal processing circuit includes a second operational amplifier, a eighth resistor, a ninth resistor, a tenth resistor, and an eleventh resistor; wherein a first end of the eighth resistor is connected to the anode of the first diode, and a second of the eighth resistor is connected to the voltage/resistance input; wherein a first end of the ninth resistor is connected to the voltage/resistance input, and a second end of the ninth resistor is connected with a first inverting input of the second operational amplifier through the tenth resistor, a first non-inverting input of the second operational amplifier is connected to a first output of the second operational amplifier, a first end of the eleventh resistor, and the signal input of the MPU; and wherein a second end of the eleventh resistor is grounded, a positive power supply of the second operational amplifier is connected to the operating voltage input, and a negative power supply of the second operational amplifier is grounded.

Preferably, the voltage measuring circuit includes a twelfth resistor, a thirteenth resistor, a fourteenth resistor, a fifteenth resistor, a sixteenth resistor, a seventeenth resistor, the ninth resistor, the tenth resistor, the eleventh resistor, the second operational amplifier, and the electronic switch; wherein the first end of the ninth resistor is connected to the voltage/resistance input, the second end of the ninth resistor is connected with the first inverting input of the second operational amplifier through the tenth resistor, the first non-inverting input of the second operational amplifier is connected to the first output of the second operational amplifier, the first end of the eleventh resistor, and the signal input of the MPU; wherein the second end of the eleventh resistor is grounded, first ends of the twelfth to fourteenth resistors are connected to the first inverting input of the second operational amplifier, second ends of the twelfth to fourteenth resistors are respectively connected to first to third pins of a second set of input pins of the electronic switch; and wherein a second non-inverting input of the second operational amplifier is grounded, a second inverting input of the second operational amplifier is connected with the first output of the second operational amplifier through the fifteenth resistor, the second inverting input of the second operational amplifier is connected with a second output of the second operational amplifier through the sixteenth resistor, and the second output of the second operational amplifier is connected with the signal input of the MPU through the seventeenth resistor.

Preferably, the AC measuring circuit includes a third operational amplifier, a duodiode, a NPN triode, a PNP triode, a eighteenth resistor, a nineteenth resistor, a twentieth resistor, a twenty-first resistor, a twenty-second resistor, a twenty-third resistor, a twenty-fourth resistor, a twenty-fifth resistor, a twenty-sixth resistor, a twenty-seventh resistor, a twenty-eighth resistor, a twenty-ninth resistor, a thirtieth resistor, a first capacitor, and a second capacitor; wherein first ends of the eighteenth to twenty-third resistors are connected to a dotted terminal of the secondary winding of the current transformer, and the other end of the secondary winding of the current transformer is grounded; wherein a second end of the eighteenth resistor and a second end of the nineteenth resistor are connected to an emitter of the PNP triode, a base of the PNP triode and a base of the NPN triode both are connected to the controlling output of the MPU, a collector of the PNP triode is connected to a collector of the NPN triode, an emitter of the NPN triode is grounded; wherein second ends of the twentieth to twenty-second resistors are grounded, a second end of the twenty-third resistor is connected to a first end of the twenty-fourth resistor and a first non-inverting input of the third operational amplifier, a first inverting input of the third operational amplifier is grounded, a first output of the third operational amplifier is connected to a second end of the twenty-fourth resistor, the first output of the third operational amplifier is connected with the signal input of the MPU through the twenty-fifth resistor; wherein a positive power supply of the third operational amplifier is connected to the operating voltage input, a negative power supply of the third operational amplifier is grounded, a second non-inverting input of the third operational amplifier is grounded, a second inverting input of the third operational amplifier is connected to first ends of the twenty-sixth resistor, twenty-seventh resistor and twenty-eighth resistor, a second end of the twenty-sixth resistor is connected to the first end of the twenty-second resistor, a second end of the twenty-seventh resistor is connected to a first end of the duodiode, a second end of the twenty-eighth resistor is connected to a second end of the duodiode and a first end of the twenty-ninth resistor, and a third end of the duodiode is connected to a second output of the third operational amplifier; and wherein a second end of the twenty-ninth resistor is connected to the signal input of the MPU, the second end of the twenty-ninth resistor is grounded through the thirtieth resistor, the first capacitor and the twenty-eighth resistor are connected in parallel, and the second capacitor and the thirtieth resistor are connected in parallel.

The present invention further provide an automatic measurement method of the above digital clamp meter defined, includes steps of measuring alternating current and measuring voltage/resistance, wherein:

the step of measuring alternating current comprising:
the MPU controlling the AC measuring circuit to detect induced current generated in the secondary winding of the current transformer, the AC measuring circuit converting the induced AC voltage to frequency signal of the measured AC and DC voltage signal corresponding to the measured AC; and
the MPU receiving the frequency signal of the measured AC and DC voltage signal corresponding to the measured AC, and determining frequency value and current value of the measured AC through detecting the frequency signal and DC voltage signal when the voltage of the DC voltage signal exceeds a first threshold voltage, and outputting the frequency value and current value to the displayer to display; and the step of measuring voltage/resistance comprising:
the voltage/resistance measuring circuit detecting inputted voltage or resistance and outputting voltage signal; and
the MPU receiving the voltage signal of the voltage/resistance measuring circuit, and determining whether the voltage of the voltage signal exceeds a second threshold voltage;
when the voltage of the voltage signal exceeds the second threshold voltage, the MPU determining that the voltage signal indicates inputted signal to be measured being voltage, and determining the measured voltage being AC voltage signal or DC voltage signal through high speed sampling of the voltage signal, if the voltage obtained by high speed sampling of the voltage signal exceeding a third threshold voltage, the measured voltage being AC voltage signal, and otherwise, being DC voltage signal, wherein the third threshold voltage is larger than the second threshold voltage;

when the measured voltage is DC voltage signal, the MPU calculating corresponding DC voltage value according to the voltage signal and outputs the DC voltage value to the displayer to display;

when the measured voltage is AC voltage signal, the MPU analyzing and calculating the frequency signal of the measured voltage to obtain the best sampling rate, sampling the AC voltage signal at the best sampling rate to calculate the AC voltage value, and outputting the AC voltage value to the displayer to display;

when the voltage of the voltage signal does not exceed the second threshold voltage, the MPU determining that inputted signal to be measured is resistance, and calculating resistance value according to the voltage signal.

Preferably, after the MPU calculating resistance, further includes: the MPU determining whether the resistance is less the predetermined resistance, when the resistance is not less than the predetermined resistance, the MPU outputting the resistance value to the displayer to display; when the resistance is less than the predetermined resistance, the MPU controlling the alarm to alarm.

Compared to the art, the present digital clamp meter can automatic identify and measure the AC, voltage/resistance, thus the present digital clamp meter needs not any selection of measuring functions, which greatly improves production efficiency, and makes using of such digital clamp meter be extremely convenient.

The present invention will now be more particularly described, by way of example only, with reference to the accompanying drawings.

DETAILED DESCRIPTION OF THE PREFERRED EMBODIMENTS

It should be understood that the embodiment described below are used to explain the present invention clearly, and should not limit the scope of the present invention.

The present invention provides a digital clamp meter.

Figure 1:
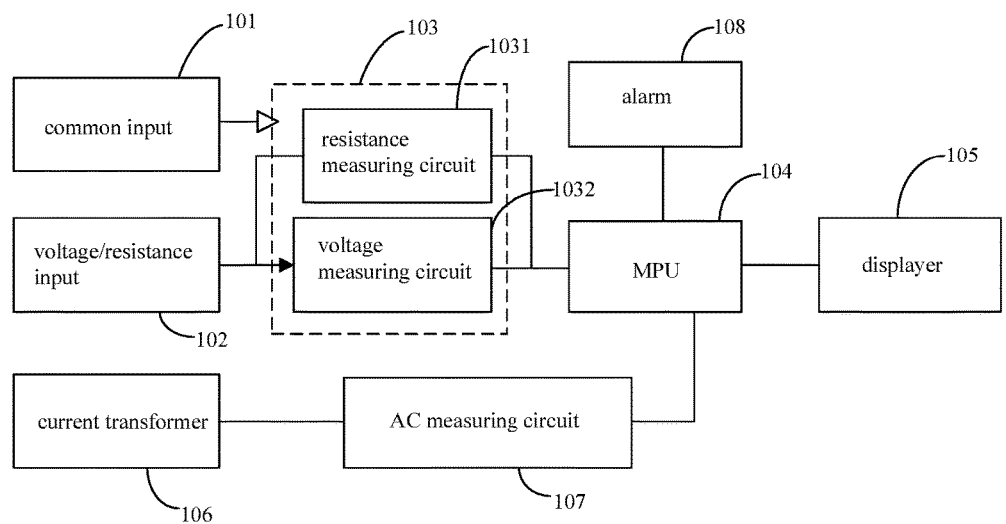
FIG. 1 is a block diagram of a digital clamp meter according to an embodiment of the present invention.

Referring to FIG. 1, which shows a block diagram of an embodiment of the present digital clamp meter.

In this embodiment, the digital clamp meter includes a common input 101, a voltage/resistance input 102, a voltage/resistance measuring circuit 103, a micro processor unit (MPU) 104, a displayer 105, a current transformer 106, an alternating current (AC) measuring circuit 107, and an alarm 108.

The common input 101 is a detected common input for signals to be measured.

The voltage/resistance input 102 is used to cooperate with the common input 101, inputting voltage or resistance to be measured.

The voltage/resistance measuring circuit 103 is for detecting and processing the voltage or resistance to be measured. In this embodiment, the voltage/resistance measuring circuit 103 includes a resistance measuring circuit 1031 and a voltage measuring circuit 1032.

The MPU 104 is for controlling the voltage/resistance measuring circuit 103 and processing outputting signal of the voltage/resistance measuring circuit 103, and controlling the displayer 105 to display measured voltage value or resistance value. The MPU 104 controls working of the AC measuring circuit 107 and processes outputting signal of the AC measuring circuit 107, and controls the displayer 105 to display measured AC value.

The displayer 105 is used to show values of measured voltage, resistance, or AC.

The current transformer 106 is used for induction detecting when the measured signal is AC. In this embodiment, the current transformer 106 is a clamp-on current transformer 106.

The AC measuring circuit 107 is used for detecting and processing of induction current generated in a secondary winding of the current transformer 106.

The alarm 108 is used to alarm sound when the measured resistance less than a predetermined value. In this embodiment, the alarm 108 is a buzzer.

In details, the common input 101 is grounded. A detecting input of the voltage measuring circuit 1032 and a detecting input of the resistance measuring circuit 1031 are connected to the voltage/resistance input 102. A detecting output of the voltage measuring circuit 1032 and a detecting output of the resistance measuring circuit 1031 are connected to a signal input of the MPU 104. A controlled terminal of the resistance measuring circuit 1031 is connected to a controlling output of the MPU 104 (not shown). A controlled terminal of the voltage measuring circuit 1032 is connected to the controlling output of the MPU 104. A signal output of the MPU 104 is connected to the displayer 105. A detecting input of the AC measuring circuit 107 is connected to the secondary winding of the current transformer 106. A detecting output of the AC measuring circuit 107 is connected to the signal input of the MPU 104. A controlled terminal of the AC measuring circuit 107 is connected to the controlling output of the MPU 104. The alarm 108 is connected to the MPU 104.

Figure 2:
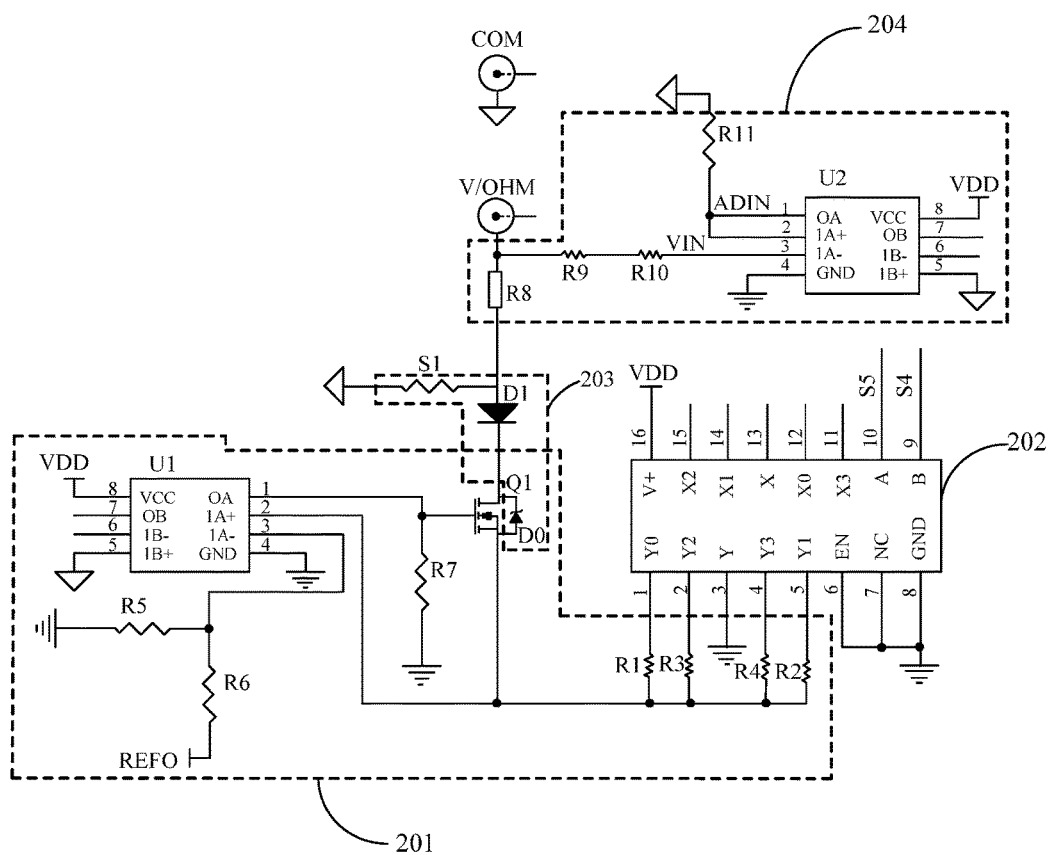
FIG. 2 shows a circuit diagram of a resistance measuring circuit of the digital clamp meter of FIG. 1.

FIG. 2 is a circuit diagram of the resistance measuring circuit 1031 of an embodiment of the present digital clamp meter.

Referring to FIGS. 1 and 2, in this embodiment, the resistance measuring circuit 1031 includes a constant-current source circuit 201, an electronic switch 202, a high voltage protecting circuit 203, and a voltage signal processing circuit 204. In this embodiment, the electronic switch 202 is SGM4582.

In details, the constant-current source circuit 201 is connected with the voltage signal processing circuit 204 through the high voltage protecting circuit 203. The constant-current source circuit 201 is also connected to an input of the electronic switch 202. Channel selecting pins A, B of the electronic switch 202 i.e., the ninth and tenth pins of the electronic switch 202 shown in FIG. 2, are connected to the MPU 104. Thus, the MPU 104 outputs controlling signals S4 and S5 to the electronic switch 202 to control selecting of input channel of the electronic switch 202.

In this embodiment, the constant-current source circuit 201 includes an operating voltage input VDD, a reference voltage input REFO, a first operational amplifier U1, a NMOS transistor Q1, a first resistor R1, a second resistor R2, a third resistor R3, a fourth resistor R4, a fifth resistor R5, a sixth resistor R6, and a seventh resistor R7. In this embodiment, the first operational amplifier U1 is TP358.

In details, a positive power supply VCC of the first operational amplifier U1 is connected to the operating voltage input VDD, a negative power supply GND of the first operational amplifier U1 is grounded, and a first non-inverting input 1A+ of the first operational amplifier U1 is connected to first ends of the first, second, third, and fourth resistors R1~R4. A second end of the first resistor R1 is connected to a first pin Y0 of a first set of input pins of the electronic switch 202, a second end of the second resistor R2 is connected to a second pin Y1 of the first set of input pins of the electronic switch 202, a second end of the third resistor R3 is connected to a third pin Y2 of the first set of input pins of the electronic switch 202, and a second end of the fourth resistor R4 is connected to a fourth pin Y3 of the first set of input pins of the electronic switch 202. The common pin Y, GND pin, EN pin, and NC pin of the electronic switch 202 are grounded. The source pin V+ of the electronic switch 202 is connected to the operating voltage input VDD. The channel selecting pins A, B of the electronic switch 202 are connected to the controlling output of the MPU 104.

A first inverting input 1A− of the first operational amplifier U1 is connected to first ends of fifth and six resistors R5~R6. A second end of the fifth resistor R5 is grounded. A second end of the sixth resistor R6 is connected to the reference voltage input REFO. A first output OA of the first operational amplifier U1 is connected to a gate of the NMOS transistor Q1 and a first end of the seventh resistor R7. A second end of the seventh resistor R7 is grounded. A source of the NMOS transistor Q1 is connected to the high voltage protecting circuit 203. A drain of the NMOS transistor Q1 is connected to the first non-inverting input 1A+ of the first operational amplifier U1.

In this embodiment, the high voltage protecting circuit 203 includes a first diode D1, a varistor S1, and a diode D0 of the NMOS transistor Q1.

In details, a cathode of the first diode D1 is connected to a cathode of the diode D0 of the NMOS transistor Q1. An anode of the first diode D1 is connected to a first end of the varistor S1 and the voltage signal processing circuit 204. A second end of the varistor S1 is grounded.

The voltage signal processing circuit 204 includes a second operational amplifier U2, a eighth resistor R8, a ninth resistor R9, a tenth resistor R10, and an eleventh resistor R11. In this embodiment, the eighth resistor R8 is thermistor. The second operational amplifier U2 is TP358.

In details, a first end of the eighth resistor R8 is connected to the anode of the first diode D1, and a second of the eighth resistor R8 is connected to a voltage/resistance input V/OHM, i.e., the voltage/resistance input 102 of FIG. 1. A first end of the ninth resistor R9 is connected to the voltage/resistance input V/OHM, and a second end of the ninth resistor R9 is connected with a first inverting input 1A− of the second operational amplifier U2 through the tenth resistor R10. A first non-inverting input 1A+ of the second operational amplifier U2 is connected to a first output OA of the second operational amplifier U2 and a first end of the eleventh resistor R11. The first output OA of the second operational amplifier U2 is also connected to the signal input of the MPU 104. Thus, the first output OA of the second operational amplifier U2 outputs voltage signal ADIN corresponding to the measured resistance to the signal input of the MPU 104. A second end of the eleventh resistor R11 is grounded. A positive power supply VCC of the second operational amplifier U2 is connected to the operating voltage input VDD, and a negative power supply GND of the second operational amplifier U2 is grounded.

Referring to FIGS. 1 and 2, in this embodiment, a method of the resistance measuring circuit 1031 measuring resistance differs from the measurement method of constant-voltage of the related clamp meters in the art. In this embodiment, the resistance to be measured is connected between the voltage/resistance input V/OHM and common input COM (corresponding to the common input 101 of FIG. 1). The present resistance measurement method takes full advantage of low-side drive of the NMOS transistor Q1, utilizing the first operational amplifier U1, the NMOS transistor Q1, and the first to seventh resistors R1~R7, i.e., the constant-current source circuit 201, to realize measuring resistance by constant-current. Thus, in this embodiment, the resistance measuring circuit 1031 measures resistance through constant-current. In addition, in the resistance measuring circuit 1031, the first diode D1, the diode D0 of the NMOS transistor Q1, and the varistor S1 cooperatively constitute the high voltage protecting circuit 203, being low in cost and efficient.

Figure 3:
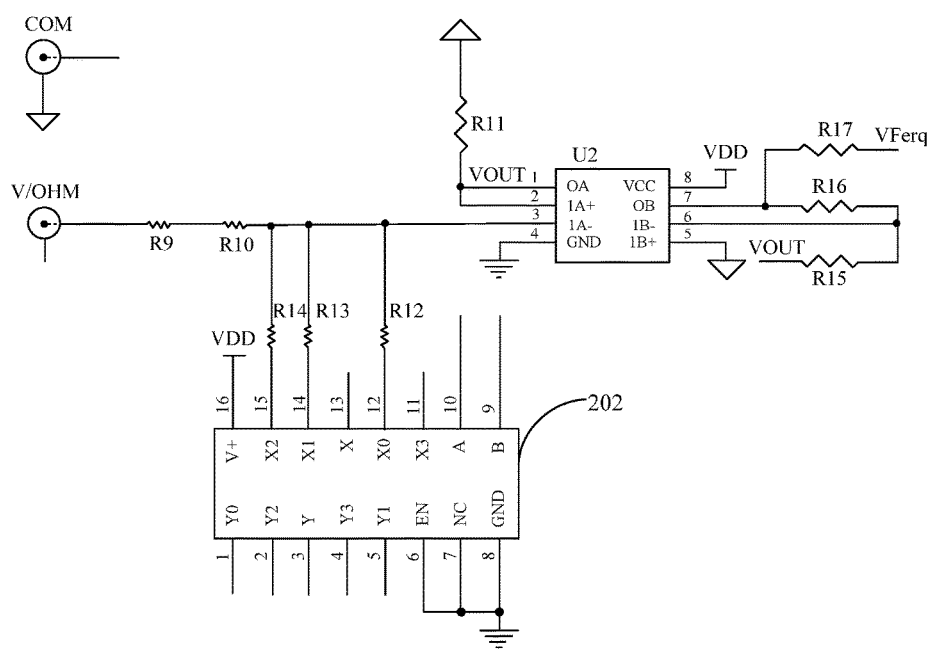
FIG. 3 shows a circuit diagram of a voltage measuring circuit of the digital clamp meter of FIG. 1.

FIG. 3 shows a circuit diagram of the voltage measuring circuit 1032 of an embodiment of the present digital clamp meter.

Referring to FIGS. 1~3, in this embodiment, the voltage measuring circuit 1032 includes a twelfth resistor R12, a thirteenth resistor R13, a fourteenth resistor R14, a fifteenth resistor R15, a sixteenth resistor R16, a seventeenth resistor R17, the ninth resistor R9, the tenth resistor R10, the eleventh resistor R11, the second operational amplifier U2, and the electronic switch 202. Thus, the ninth resistor R9, the tenth resistor R10, the eleventh resistor R11, the second operational amplifier U2, and the electronic switch 202 are elements of both of the voltage measuring circuit 1032 and the resistance measuring circuit 1031.

In details, the first end of the ninth resistor R9 is connected to the voltage/resistance input V/OHM, and the second end of the ninth resistor R9 is connected with the first inverting input 1A− of the second operational amplifier U2 through the tenth resistor R10. The first non-inverting input 1A+ of the second operational amplifier U2 is connected to the first output OA of the second operational amplifier U2 and the first end of the eleventh resistor R11. The first output OA of the second operational amplifier U2 is also connected to the signal input of the MPU 104. Thus, the first output OA of the second operational amplifier U2 outputs voltage signal VOUT corresponding to the measured voltage to the signal input of the MPU 104. The second end of the eleventh resistor R11 is grounded. First ends of the twelfth to fourteenth resistors R12~R14 are connected to the first inverting input 1A− of the second operational amplifier U2. Second ends of the twelfth to fourteenth resistors R12~R14 are respectively connected to first to third pins X0, X1 and X2 of a second set of input pins of the electronic switch 202. A second non-inverting input 1B+ of the second operational amplifier U2 is grounded. A second inverting input 1B− of the second operational amplifier U2 is connected with the first output OA of the second operational amplifier U2 through the fifteenth resistor R15. The second inverting input 1B− of the second operational amplifier U2 is connected with a second output OB of the second operational amplifier U2 through the sixteenth resistor R16. The second output OB of the second operational amplifier U2 is connected with the signal input of the MPU 104 through the seventeenth resistor R17. Thus, in this embodiment, the second output OB of the second operational amplifier U2 outputs frequency signal VFreq of the measured voltage. The frequency signal VFreq is transmitted to the signal input of the MPU 104 through the seventeenth resistor R17.

Referring to FIGS. 1~3, in this embodiment, the voltage to be measured is inputted through the voltage/resistance input V/OHM and common input COM. The voltage to be measured is divided by the ninth resistor R9, the tenth resistor R10, the twelfth resistor R12, the thirteenth resistor R13, and the fourteenth resistor R14, and then the corresponding voltage signal VOUT of the measured voltage is transmitted to the MPU 104 through the second operational amplifier U2. The MPU 104 determines the measured voltage being AC voltage signal or DC voltage signal based on high speed sampling of the voltage signal VOUT. At the same time, the MPU 104 analyzes and calculates the frequency signal VFreq of the measured voltage to obtain the best sampling rate for AC voltage signal, and samples the AC voltage signal at the best sampling rate.

Figure 4:
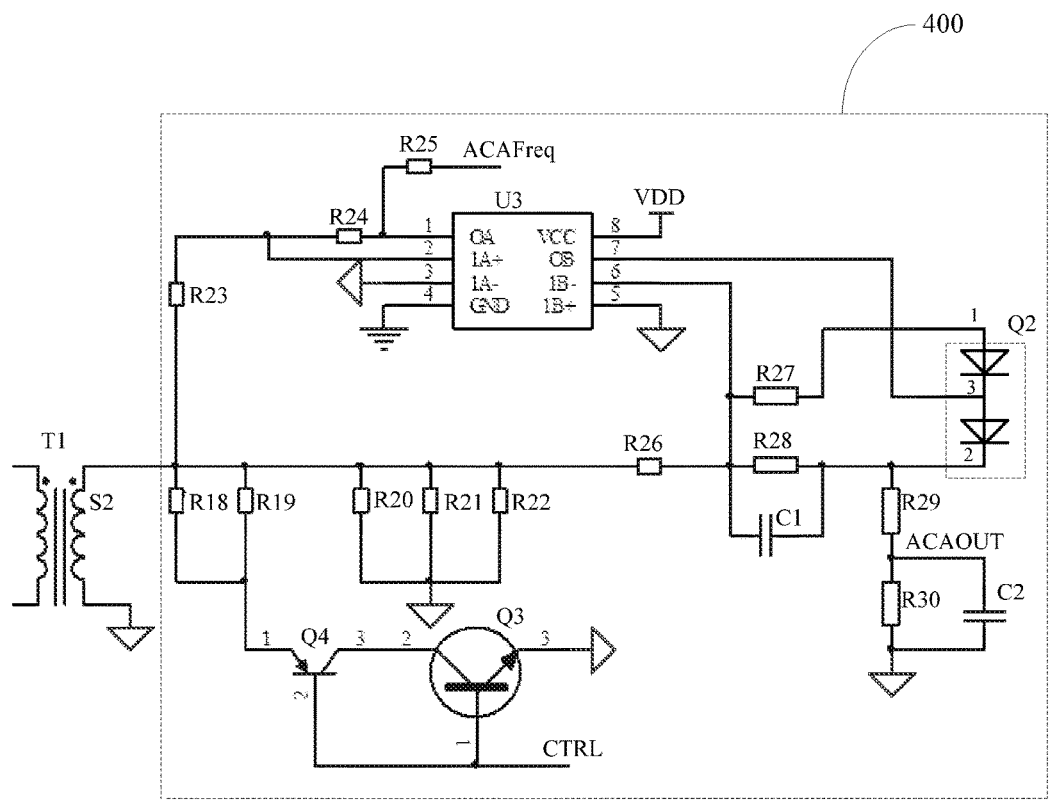
FIG. 4 shows a circuit diagram of an alternating current measuring circuit of the digital clamp meter of FIG. 1.

FIG. 4 shows a circuit diagram of the AC measuring circuit 107 according to an embodiment of the present digital clamp meter.

Referring to FIG. 1 and FIG. 4, in this embodiment, the AC measuring circuit 107 includes a third operational amplifier U3, a duodiode Q2, a NPN triode Q3, a PNP triode Q4, a eighteenth resistor R18, a nineteenth resistor R19, a twentieth resistor R20, a twenty-first resistor R21, a twenty-second resistor R22, a twenty-third resistor R23, a twenty-fourth resistor R24, a twenty-fifth resistor R25, a twenty-sixth resistor R26, a twenty-seventh resistor R27, a twenty-eighth resistor R28, a twenty-ninth resistor R29, a thirtieth resistor R30, a first capacitor C1, and a second capacitor C2. In this embodiment, the third operational amplifier U3 is TP358.

In details, first ends of the eighteenth to twenty-third resistors R18~R23 are connected to a dotted terminal of the secondary winding S2 of the current transformer T1 (i.e., the current transformer 106 of FIG. 1). The other end of the secondary winding S2 of the current transformer T1 is grounded. A second end of the eighteenth resistor R18 and a second end of the nineteenth resistor R19 are connected to an emitter of the PNP triode Q4. A base of the PNP triode Q4 and a base of the NPN triode Q3 both are connected to the controlling output of the MPU 104. Thus, in this embodiment, the MPU 104 outputs controlling signal CTRL to the bases of the PNP triode Q4 and NPN triode Q3, thereby controlling conduction of the NPN triode Q3 and PNP triode Q4. A collector of the PNP triode Q4 is connected to a collector of the NPN triode Q3. An emitter of the NPN triode Q3 is grounded. Second ends of the twentieth to twenty-second resistors R20~R22 are grounded. A second end of the twenty-third resistor R23 is connected to a first end of the twenty-fourth resistor R24 and a first non-inverting input 1A+ of the third operational amplifier U3. A first inverting input 1A− of the third operational amplifier U3 is grounded. A first output OA of the third operational amplifier U3 is connected to a second end of the twenty-fourth resistor R24. The first output OA of the third operational amplifier U3 is connected with the signal input of the MPU 104 through the twenty-fifth resistor R25. Thus, in this embodiment, the first output OA of the third operational amplifier U3 outputs a frequency signal ACAFreq of the measured AC. The frequency signal ACAFreq is transmitted to the signal input of the MPU 104 through the twenty-fifth resistor R25. A positive power supply VCC of the third operational amplifier U3 is connected to the operating voltage input VDD, and a negative power supply GND of the third operational amplifier U3 is grounded. A second non-inverting input 1B+ of the third operational amplifier U3 is grounded. A second inverting input 1B− of the third operational amplifier U3 is connected to first ends of the twenty-sixth resistor R26, twenty-seventh resistor R27 and twenty-eighth resistor R28. A second end of the twenty-sixth resistor R26 is connected to the first end of the twenty-second resistor R22. A second end of the twenty-seventh resistor R27 is connected to a first end of the duodiode Q2 (labeled "1" in FIG. 4). A second end of the twenty-eighth resistor R28 is connected to a second end of the duodiode Q2 (labeled "2" in FIG. 4) and a first end of the twenty-ninth resistor R29. A third end of the duodiode Q2 (labeled "3" in FIG. 4) is connected to a second output OB of the third operational amplifier U3. A second end of the twenty-ninth resistor R29 is connected to the signal input of the MPU 104. In this embodiment, the second end of the twenty-ninth resistor R29 outputs DC voltage signal ACAOUT corresponding to the measured AC to the signal input of the MPU 104. The second end of the twenty-ninth resistor R29 is grounded through the thirtieth resistor R30. The first capacitor C1 and the twenty-eighth resistor R28 are connected in parallel, and the second capacitor C2 and the thirtieth resistor R30 are connected in parallel.

Referring to FIG. 1 and FIG. 4, in this embodiment, the AC to be measured flows through the current transformer T1 and then generates induced current in the secondary winding S2 of the current transformer T1. The induced current flows through the eighteenth resistor R18, the nineteenth resistor R19, the twentieth resistor R20, the twenty-first resistor R21, and the twenty-second resistor R22, and generates different induced AC voltages. The third operational amplifier U3 converts the induced AC voltages to the frequency signals ACAFreq of the measured AC and DC voltage signals ACAOUT corresponding to the measured AC, and outputs the frequency signals ACAFreq and DC voltage signals ACAOUT to the MPU 104. The MPU 104 determines frequency and voltage of the measured AC by detecting the frequency signals ACAFreq and DC voltage signals ACAOUT.

The above embodiment of the present digital clamp meter includes the common input 101, the voltage/resistance input 102, the current transformer 106, the voltage/resistance measuring circuit 103, the AC measuring circuit 107, the MPU 104, the displayer 105 and the alarm 108. The common input 101 is grounded. The detecting input of the voltage/resistance measuring circuit 103 is connected to the voltage/resistance input 102, the detecting output of the voltage/resistance measuring circuit 103 is connected to the signal input of the MPU 104, and the controlled terminal of the voltage/resistance measuring circuit 103 is connected to the controlling output of the MPU 104. The detecting input of the AC measuring circuit 107 is connected to the secondary winding of the current transformer 106, the detecting output of the AC measuring circuit 107 is connected to the signal input of the MPU 104, and the controlled terminal of the AC measuring circuit 107 is connected to the controlling output of the MPU 104. The signal output of the MPU 104 is connected to the displayer 105 and alarm 108. The present digital clamp meter has advantages of selecting functions automatically: resistance and voltage (including AC voltage and DC voltage) to be measured are inputted through the same voltage/resistance input 102, thus the present digital clamp meter needs not any selection of measuring functions, and can identify the signal to be measured automatically, and display the results, which greatly improves production efficiency.

In production operation, the related manual measuring meter needs to switch among dozens of gears when the signals to be measured are different in types. The related automatic measuring meter needs to press function keys frequency to switch in a number of gears, which wastes of time greatly. The present digital clamp meter needs not any selection in measuring functions, and identifies the signals automatically and displays the results. Accordingly, the present digital clamp meter improves the production efficiency greatly.

Figure 5:
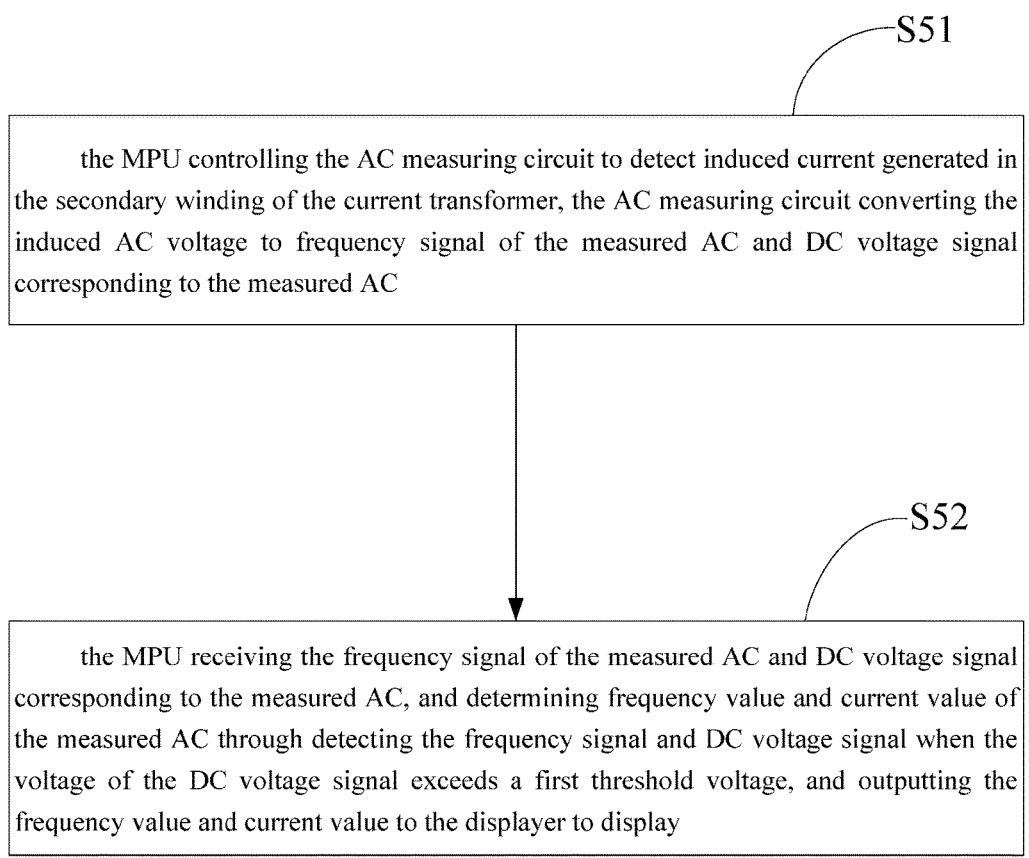
FIG. 5 shows steps of a method for measuring alternating current using the present digital clamp meter.
Figure 6:
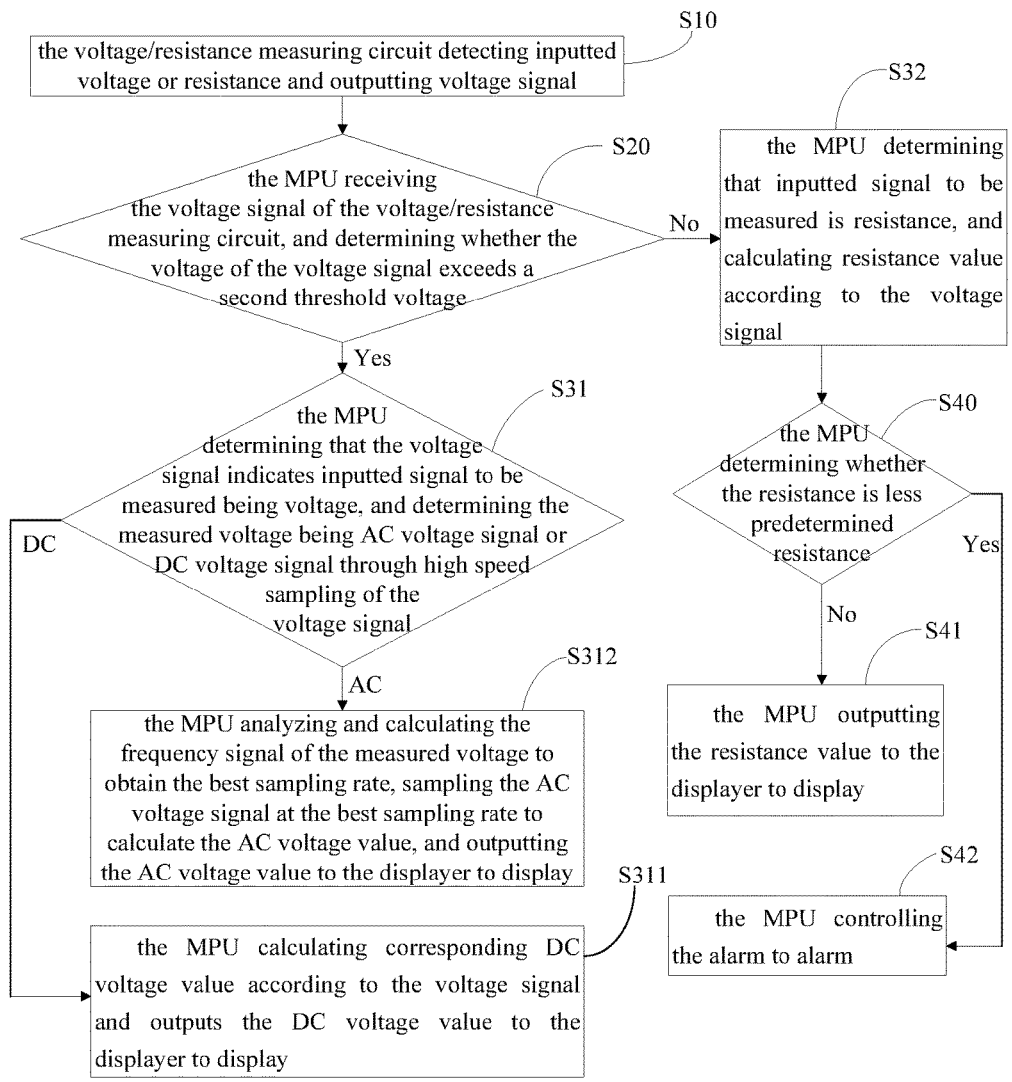
FIG. 6 shows steps of a method for measuring voltage/resistance using the present digital clamp meter.

For achieving the above purpose, the present invention further provides an automatic measurement method for the above digital clamp meter. Referring to FIGS. 5 and 6, according to an embodiment, the present automatic measurement method includes steps of measuring AC and measuring voltage/resistance.

As shown in FIG. 5, measuring AC includes:

Step S51, the MPU 104 controlling the AC measuring circuit 107 to detect induced current generated in the secondary winding of the current transformer 106, the AC measuring circuit 107 converting the induced AC voltage to frequency signal of the measured AC and DC voltage signal corresponding to the measured AC; and Step S52, the MPU 104 receiving the frequency signal of the measured AC and DC voltage signal corresponding to the measured AC, and determining frequency value and current value of the measured AC through detecting the frequency signal and DC voltage signal when the voltage of the DC voltage signal exceeds a first threshold voltage, and outputting the frequency value and current value to the displayer 105 to display.

In details, referring to FIG. 1 and FIG. 4, the AC measuring circuit 107 converts the induced AC voltage to the frequency signal ACAFreq of the measured AC and the DC voltage signal ACAOUT corresponding to the measured AC, and outputs to the signal input of the MPU 104. The MPU 104 determines the frequency value and current value of the measured AC through detecting the frequency signal ACAFreq and DC voltage signal ACAOUT.

In step S52, when the voltage of the DC voltage signal ACAOUT exceeds the first threshold voltage, the MPU 104 determines the frequency value and current value of the measured AC through detecting the frequency signal ACAFreq and DC voltage signal ACAOUT. In this embodiment, the first threshold voltage is 100 μV. Accordingly, the first threshold can be adjusted according to need, and is not limited to be 100 μV.

When the voltage of the DC voltage signal ACAOUT does not exceed the first threshold voltage, it means no AC or the AC being negligibly small, and thus does not display in such a state.

Referring to FIG. 6, measuring voltage/resistance includes:

Step S10, the voltage/resistance measuring circuit 103 detecting inputted voltage or resistance and outputting voltage signal; and Step S20, the MPU 104 receiving the voltage signal of the voltage/resistance measuring circuit 103, and determining whether the voltage of the voltage signal exceeds a second threshold voltage.

When the voltage of the voltage signal exceeds the second threshold voltage, performs step S31: the MPU 104 determining that the voltage signal indicates inputted signal to be measured being voltage, and determining the measured voltage being AC voltage signal or DC voltage signal through high speed sampling of the voltage signal. If the voltage obtained by high speed sampling of the voltage signal exceeds a third threshold voltage, it means the measured voltage being AC voltage signal, otherwise, being DC voltage signal. The third threshold voltage is larger than the second threshold voltage.

When the measured voltage is DC voltage signal, performs step S311: the MPU 104 calculating corresponding DC voltage value according to the voltage signal and outputs the DC voltage value to the displayer 105 to display.

When the measured voltage is AC voltage signal, performs step S312: the MPU 104 analyzing and calculating the frequency signal of the measured voltage to obtain the best sampling rate, sampling the AC voltage signal at the best sampling rate to calculate the AC voltage value, and outputting the AC voltage value to the displayer 105 to display.

When the voltage of the voltage signal does not exceed the second threshold voltage, performs step S32: the MPU 104 determining that inputted signal to be measured is resistance, and calculating resistance value according to the voltage signal.

In details, Referring to FIGS. 1—3, the voltage/resistance measuring circuit 103 includes the resistance measuring circuit 1031 and the voltage measuring circuit 1032. The resistance measuring circuit 1031 includes the constant-current source circuit 201, the electronic switch 202, the high voltage protecting circuit 203, and the voltage signal processing circuit 204.

In step S10, when resistance is inputted through the common input COM and the voltage/resistance input V/OHM for measurement, the constant-current source circuit 201 of the resistance measuring circuit 1031 can detect inputting of the resistance by constant-current measurement method, and outputs the voltage signal ADIN corresponding to the measured resistance to the signal input of the MPU 104.

When voltage is inputted through the common input COM and the voltage/resistance input V/OHM for measurement, the voltage measuring circuit 1032 can detect inputting of the voltage and outputs the voltage signal VOUT corresponding to the measured voltage to the signal input of the MPU 104. The MPU 104 determines the measured voltage being AC voltage signal or DC voltage signal through high speed sampling of the voltage signal VOUT. At the same time, the MPU 104 analyzes and calculates the frequency signal VFreq of the measured voltage to obtain the best sampling rate for the AC voltage signal, and samples the AC voltage signal at the best sampling rate.

In step S20, the MPU 104 receives the voltage signal of the voltage/resistance measuring circuit 103, determines voltage being inputted or resistance being inputted through determining whether the voltage signal exceeds the second threshold voltage, and determines the measured voltage be AC voltage signal or DC voltage signal by comparing the voltage obtained by high speed sampling of the voltage signal to the third threshold voltage. In this embodiment, the second threshold voltage is 0.3V, and the third threshold voltage is 0.8V. Accordingly, the second threshold voltage and third threshold voltage can be changed according to need.

In this embodiment, after the step of the MPU 104 calculating resistance value according to the voltage signal (i.e, step S32), further includes step S40: the MPU 104 determining whether the resistance value is less the predetermined resistance.

When the resistance is not less than the predetermined resistance, perform step S41: the MPU 104 outputs the resistance value to the displayer 105 to display. While, if the resistance is less than the predetermined resistance, perform step S42: the MPU 104 controlling the alarm 108 to alarm.

In step S40, the MPU 104 determines whether the resistance is less the predetermined resistance. In this embodiment, the predetermined resistance is 50Ω. The predetermined resistance can be changed according to need.

The automatic measurement method of the present digital clamp meter can automatic identify and measure the AC, voltage/resistance, which makes using of such digital clamp meter be extremely convenient.

Therefore, the embodiments described above are provided by way of examples only, and various other modifications will be apparent to persons skilled in the field without departing from the scope of the invention as defined herein.

The invention claimed is:

1. A digital clamp meter, comprising:
   a common input;
   a voltage/resistance input cooperating with the common input for inputting voltage to be measured or resistance to be measured;
   a voltage/resistance measuring circuit for detecting and processing the voltage to be measured or resistance to be measured;
   a current transformer for induction detecting when the measured signal is alternating current;
   an AC measuring circuit for detecting and processing induction current generated in a secondary winding of the current transformer;
   a displayer for displaying values of measured voltage, resistance or alternating current; and
   a MPU for controlling working of the voltage/resistance measuring circuit and processing outputting signal of the voltage/resistance measuring circuit, controlling the displayer to display value of measured voltage or resistance, controlling working of the AC measuring circuit and processing outputting signal of the AC measuring circuit, and controlling the displayer to display measured AC value;
   wherein a detecting input of the voltage/resistance measuring circuit is connected to the voltage/resistance input, a detecting output of the voltage/resistance measuring circuit is connected to a signal input of the MPU, and a controlled terminal of the voltage/resistance measuring circuit is connected to a controlling output of the MPU; the signal output of the MPU is connected to the displayer; the common input is grounded; a detecting input of the AC measuring circuit is connected to the secondary winding of the current transformer, a detecting output of the AC measuring circuit is connected to the signal input of the MPU, and a controlled terminal of the AC measuring circuit is connected to the controlling output of the MPU;
   wherein the voltage/resistance measuring circuit comprises a voltage measuring circuit and a resistance measuring circuit, detecting inputs of the voltage measuring circuit and resistance measuring circuit are connected to the voltage/resistance input, detecting outputs of the voltage measuring circuit and resistance measuring circuit are connected to the signal input of the MPU, and controlled terminals of the voltage measuring circuit and resistance measuring circuit are connected to the controlling output of the MPU;
   wherein the resistance measuring circuit comprises a constant-current source circuit, an electronic switch, a voltage protecting circuit, and a voltage signal processing circuit; and wherein the constant-current source circuit is connected with the voltage signal processing circuit through the voltage protecting circuit, the constant-current source circuit is connected to an input of the electronic switch, and channel selecting pins of the electronic switch are connected to the MPU; and
   wherein the constant-current source circuit comprises an operating voltage input, a reference voltage input, a first operational amplifier, a NMOS transistor, a first resistor, a second resistor, a third resistor, a fourth resistor, a fifth resistor, a sixth resistor, and a seventh resistor; wherein a positive power supply of the first operational amplifier is connected to the operating voltage input, a negative power supply of the first operational amplifier is grounded, and a first non-inverting input of the first operational amplifier is connected to first ends of the first, second, third, and fourth resistors; wherein a second end of the first resistor is connected to a first pin of a first set of input pins of the electronic switch, a second end of the second resistor is connected to a second pin of the first set of input pins of the electronic switch, a second end of the third resistor is connected to a third pin of the first set of input pins of the electronic switch, and a second end of the fourth resistor is connected to a fourth pin of the first set of input pins of the electronic switch; wherein the common pin Y, GND pin, EN pin, and NC pin of the electronic switch are grounded, the source pin of the electronic switch is connected to the operating voltage input, and the channel selecting pins of the electronic switch are connected to the controlling output of the MPU; wherein a first inverting input of the first operational amplifier is connected to first ends of fifth and six resistors, a second end of the fifth resistor is grounded, and a second end of the sixth resistor is connected to the reference voltage input; and wherein a first output of the first operational amplifier is connected to a gate of the NMOS transistor and a first end of the seventh resistor, a second end of the seventh resistor is grounded, a source of the NMOS transistor is connected to the voltage protecting circuit, and a drain of the NMOS transistor is connected to the first non-inverting input of the first operational amplifier.

2. The digital clamp meter of claim 1, further comprising an alarm connected to the MPU, the alarm being used to alarm sound when the measured resistance value less than a predetermined value.

3. The digital clamp meter of claim 1, wherein the voltage protecting circuit comprises a first diode, a varistor, and a diode of the NMOS transistor; and wherein a cathode of the first diode is connected to a cathode of the diode of the NMOS transistor, an anode of the first diode is connected to a first end of the varistor and the voltage signal processing circuit, and a second end of the varistor is grounded.

4. The digital clamp meter of claim 3, wherein the voltage signal processing circuit comprises a second operational amplifier, a eighth resistor, a ninth resistor, a tenth resistor, and an eleventh resistor; wherein a first end of the eighth resistor is connected to the anode of the first diode, and a second of the eighth resistor is connected to the voltage/resistance input; wherein a first end of the ninth resistor is connected to the voltage/resistance input, and a second end of the ninth resistor is connected with a first inverting input of the second operational amplifier through the tenth resistor, a first non-inverting input of the second operational amplifier is connected to a first output of the second operational amplifier, a first end of the eleventh resistor, and the signal input of the MPU; and wherein a second end of the eleventh resistor is grounded, a positive power supply of the second operational amplifier is connected to the operating voltage input, and a negative power supply of the second operational amplifier is grounded.

5. The digital clamp meter of claim 4, wherein the voltage measuring circuit comprises a twelfth resistor, a thirteenth resistor, a fourteenth resistor, a fifteenth resistor, a sixteenth resistor, a seventeenth resistor, the ninth resistor, the tenth resistor, the eleventh resistor, the second operational amplifier, and the electronic switch; wherein the first end of the ninth resistor is connected to the voltage/resistance input, the second end of the ninth resistor is connected with the first inverting input of the second operational amplifier through the tenth resistor, the first non-inverting input of the second operational amplifier is connected to the first output of the second operational amplifier, the first end of the eleventh resistor, and the signal input of the MPU; wherein the second end of the eleventh resistor is grounded, first ends of the twelfth to fourteenth resistors are connected to the first inverting input of the second operational amplifier, second ends of the twelfth to fourteenth resistors are respectively connected to first to third pins of a second set of input pins of the electronic switch; and wherein a second non-inverting input of the second operational amplifier is grounded, a second inverting input of the second operational amplifier is connected with the first output of the second operational amplifier through the fifteenth resistor, the second inverting input of the second operational amplifier is connected with a second output of the second operational amplifier through the sixteenth resistor, and the second output of the second operational amplifier is connected with the signal input of the MPU through the seventeenth resistor.

6. A digital clamp meter, comprising:
a common input;
a voltage/resistance input cooperating with the common input for inputting voltage to be measured or resistance to be measured;
a voltage/resistance measuring circuit for detecting and processing the voltage to be measured or resistance to be measured;
a current transformer for induction detecting when the measured signal is alternating current:
an AC measuring circuit for detecting and processing induction current generated in a secondary winding of the current transformer;
a displayer for displaying values of measured voltage, resistance or alternating current; and
a MPU for controlling working of the voltage/resistance measuring circuit and processing outputting signal of the voltage/resistance measuring circuit, controlling the displayer to display value of measured voltage or resistance, controlling working of the AC measuring circuit and processing outputting signal of the AC measuring circuit, and controlling the displayer to display measured AC value;
wherein a detecting input of the voltage/resistance measuring circuit is connected to the voltage/resistance input, a detecting output of the voltage/resistance measuring circuit is connected to a signal input of the MPU, and a controlled terminal of the voltage/resistance measuring circuit is connected to a controlling output of the MPU; the signal output of the MPU is connected to the displayer; the common input is grounded; a detecting input of the AC measuring circuit is connected to the secondary winding of the current transformer, a detecting output of the AC measuring circuit is connected to the signal input of the MPU, and a controlled terminal of the AC measuring circuit is connected to the controlling output of the MPU; and
wherein the AC measuring circuit comprises a third operational amplifier, a duodiode, a NPN triode, a PNP triode, a eighteenth resistor, a nineteenth resistor, a twentieth resistor, a twenty-first resistor, a twenty-second resistor, a twenty-third resistor, a twenty-fourth resistor, a twenty-fifth resistor, a twenty-sixth resistor, a twenty-seventh resistor, a twenty-eighth resistor, a twenty-ninth resistor, a thirtieth resistor, a first capacitor, and a second capacitor; wherein first ends of the eighteenth to twenty-third resistors are connected to a dotted terminal of the secondary winding of the current transformer, and the other end of the secondary winding of the current transformer is grounded; wherein a second end of the eighteenth resistor and a second end of the nineteenth resistor are connected to an emitter of the PNP triode, a base of the PNP triode and a base of the NPN triode both are connected to the controlling output of the MPU, a collector of the PNP triode is connected to a collector of the NPN triode, an emitter of the NPN triode is grounded; wherein second ends of the twentieth to twenty-second resistors are grounded, a second end of the twenty-third resistor is connected to a first end of the twenty-fourth resistor and a first non-inverting input of the third operational amplifier, a first inverting input of the third operational amplifier is grounded, a first output of the third operational amplifier is connected to a second end of the twenty-fourth resistor, the first output of the third operational amplifier is connected with the signal input of the MPU through the twenty-fifth resistor; wherein a positive power supply of the third operational amplifier is connected to the operating voltage input, a negative power supply of the third operational amplifier is grounded, a second non-inverting input of the third operational amplifier is grounded, a second inverting input of the third operational amplifier is connected to first ends of the twenty-sixth resistor, twenty-seventh resistor and twenty-eighth resistor, a second end of the twenty-sixth resistor is connected to the first end of the twenty-second resistor, a second end of the twenty-seventh resistor is connected to a first end of the duodiode, a second end of the twenty-eighth resistor is connected to a second end of the duodiode and a first end of the twenty-ninth resistor, and a third end of the duodiode is connected to a second output of the third operational amplifier; and wherein a second end of the twenty-ninth resistor is connected to the signal input of the MPU, the second end of the twenty-ninth resistor is grounded through the thirtieth resistor, the first capacitor and the twenty-eighth resistor are connected in parallel, and the second capacitor and the thirtieth resistor are connected in parallel.

* * * * *